(12) United States Patent
Noda

(10) Patent No.: US 6,400,604 B2
(45) Date of Patent: Jun. 4, 2002

(54) NONVOLATILE SEMICONDUCTOR MEMORY DEVICE HAVING A DATA REPROGRAM MODE

(75) Inventor: Junichiro Noda, Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/764,108

(22) Filed: Jan. 19, 2001

(30) Foreign Application Priority Data

Feb. 9, 2000 (JP) ........................................ 2000-032338

(51) Int. Cl.⁷ .............................................. G11C 16/04
(52) U.S. Cl. ............................. 365/185.12; 365/185.05; 365/185.22; 365/185.23
(58) Field of Search ..................... 365/185.12, 185.23, 365/185.05, 185.18, 185.22

(56) References Cited

U.S. PATENT DOCUMENTS

| 6,049,494 A | * | 4/2000 | Sakui et al. | ................. 365/203 |
| 6,236,594 B1 | * | 5/2001 | Kwon | .................... 365/185.11 |
| 6,288,944 B1 | * | 9/2001 | Kawamura et al. | .... 365/185.22 |

FOREIGN PATENT DOCUMENTS

JP          2000-149581          5/2000

* cited by examiner

Primary Examiner—David Nelms
Assistant Examiner—Gene N. Auduong
(74) Attorney, Agent, or Firm—Oblon, Spivak, McClelland, Maier & Neustadt, P.C.

(57) ABSTRACT

A nonvolatile semiconductor memory device having a data reprogram mode comprising a memory cell array in which a plurality of memory cells are arranged in a matrix form, a page buffer storing one page data to be programmed to memory cells which are selected in accordance with a page address signal, an internal column address generating circuit for generating column addresses of the one page with inputting the page address signal in order to transfer the one data stored in the page buffer to the memory cells, a column decoder receiving the column addresses from the internal column address generating circuit, and a control circuit having a data reprogram mode which is a mode for erasing one page data stored in the memory cells which are selected in accordance with the page address signal and continuously programming the one page data stored in the page buffer to the memory cells which are selected.

7 Claims, 17 Drawing Sheets

|  |  | Erase | Program | | Read |
| --- | --- | --- | --- | --- | --- |
|  |  |  | "1"data | "2"data |  |
| BL | | Vera-Vb | Vcc | 0V | |
| selected page | GSL | F | Vcc | Vcc | Vcc |
| | CGL | 0V | Vpgm | Vpgm | 0V |
| | SSL | F | 0V | 0V | Vcc |
| non-selected page | GSL | F | 0V | 0V | 0V |
| | CGL | F | 0V | 0V | 0V |
| | SSL | F | 0V | 0V | 0V |
| SL | | Vera-Vb | 0V | 0V | 0V |
| セルPウエル | | Vera | 0V | 0V | 0V |

F : Floating

Fig.9

NONVOLATILE SEMICONDUCTOR MEMORY DEVICE HAVING A DATA REPROGRAM MODE

CROSS-REFERENCE TO RELATED APPLICATION

This application is based upon and claims the benefit of priority from the prior Japanese Patent Application No.2000-032338, filed Feb. 9, 2000, the entire contents of which are incorporated herein by reference.

BACKGROUND OF THE INVENTION

1. Field of the Invention

This invention relates to a nonvolatile semiconductor memory device (EEPROM) that can carry out a data reprogram operation, specifically, a data reprogram operation at every page.

2. Description of the Related Art

Conventionally, a byte type EEPROM (Electrically Erasable PROM) that can carry out a reprogram operation at every page is known (see W. Johnson et al, "A 16 kb Electrically Erasable Nonvolatile Memory", ISSCC Digest of Technical Papers, PP. 152–153, Feb. 1982). As shown in FIG. 11, one memory cell MC of this byte type EEPROM is connected to a bit line BL via one select transistor SG. The memory cell MC of the byte type EEPROM has a FLOTOX structure (Floating Gate Tunneling Oxide structure) in which a tunnel insulating film for a reprogram operation is formed in a part of a gate insulating film close to drain electrode. A control gate line CGL of the memory cell MC is commonly provided at every one byte memory cells. The control gate line CGL is selected by a select switch circuit S, thereby a data reprogram operation is carried out at every one byte.

On the other hand, a NAND type EEPROM (see F. Masuoka et al, "A new Flash EEPROM cell using triple polysilicon technology", IEDM Technical Digest, pp. 464–467, Dec. 1984) is suitable for reprogramming data at large scale compared to the byte type EEPROM.

As shown in FIG. 12, at the NAND type EEPROM, 16 memory cells MC0 to MC15 are serially connected. An one end of the serially connected 16 memory cells is connected to a bit line BL via a select gate transistor SG1 and an other end of the serially connected 16 memory cells is connected to a common source line SL via a select gate transistor SG2. The memory cell MC has a stacked gate structure in which a floating gate and a control gate are laminated. All of an insulating film under a lower surface of the floating gate is used as a tunneling insulation film. Electrons move between the floating gate and a channel region by FN (Fowler Nordheim) tunneling. The control gates of the 128 bytes memory cells in a row direction are commonly connected to control gate line (one of the gate control lines CGL0 to CGL15). In the NAND type EEPROM, a page buffer to which one page program data can be loaded is provided. Thereby a data program operation at every page can be carried out.

FIG. 13 shows timing diagrams of a data reprogram operation in the byte type EEPROM. In this case, timing diagrams of the data reprogram operation that can be carried out at an arbitrary unit of 1 to 32 byte(s) is shown. A chip enable signal /CE is set to Low level, thereby selecting the chip. When a write enable signal /WE is set to Low level, an address ADD and a data DATA that we want to reprogram are inputted to the chip at every byte. And then, after a page window period which is a constant time period, the reprogram operation which includes a data erase operation and a data program operation is automatically carried out.

In a case of the NAND type EEPROM, in generally, the number of the memory cells that should be erased is different from the number of the memory cells that should be programmed. The reprogram operation includes the data erase operation and the program operation. In other words, as shown in FIG. 14, the data erase operation is carried out at a NAND cell block unit. First of all, the chip enable signal /CE is set to Low level, thereby selecting the chip. After that, when a command latch enable signal CLE is set to High level and the write enable signal /WE is set to High level, a set up command for the block erase operation is inputted from a I/O terminal. Next, when an address latch enable signal ALE is set to High level and the write enable signal /WE is set to Low level, a block address which should be erased is serially inputted from the I/O terminal. And then, the command latch enable signal CLE is set to High level, the write enable signal is set to Low level and an erase execution command is inputted from the I/O terminal. Thereby the block erase operation is carried out. The block erase operation often includes an erase verify read operation which confirms an erase state.

After the block erase operation that is stated above, the data program operation to the erased block is carried out at a timing shown in FIG. 15. First of all, the chip enable signal /CE is set to Low level, thereby selecting the chip. After that, when the command latch enable signal CLE is set to High level and the write enable signal /WE is set to Low level, a set up command for the data program operation is inputted from the I/O terminal. Next, when the address latch enable signal ALE is set to High level and the write enable signal /WE is set to Low level, a page address which should be programmed is inputted from the I/O terminal. Continuously, the address latch enable signal ALE is set to Low level, the write enable signal /WE is set to Low level and one page data which should be programmed are inputted. And then, the command latch enable signal CLE is set to High level, the write enable signal /WE is set to Low level and a program execution command is inputted from the I/O terminal. Thereby the data program operation for a selected page is carried out. The data program operation often includes a program verify read which confirms a program state.

In order to store one bit data, the byte type EEPROM has two elements which are one memory cell and one select transistor. Therefore, the cell size of the byte type EEPROM can be larger and it may be hard to be large capacity and low-costed.

On the other hand, the NAND type EEPROM was developed in order to overcome the difficulties. In the NAND type EEPROM, two select transistors are provided for a plurality of memory cells (for example 16 memory cells). Therefore, a cell size in which one bit data is stored is much smaller than that of the byte type EEPROM. In a result, it is capable of be a large scale capacity and low-costed. Therefore, the NAND type EEPROM is suitable for a large scale file memory.

Nevertheless, it is necessary that the data erase operation and the data program operation are independently carried out at a date reprogram operation in the NAND type EEPROM. Because the number of the erased memory cells for a case of a normal erase is different from the number of the programmed memory cells for a case of a program in the NAND type EEPROM. Therefore, it is not easy to control the data reprogram operation. In addition, the control of the reprogram operation is more complex because a command input system is often used. For example, in the command input system, a continuous input operation that includes (1) an input of the program set up command, (2) an input of a page address, (3) an input of data and (4) an input of a program execution command must be provided. Furthermore, in the NAND type EEPROM, it is hard to carry out such a fast access as a NOR type EEPROM. Because a plurality of the memory cells are connected serially.

A data erase operation is not impossible in the NAND type EEPROM. However, when we use a conventional control method for the reprogram operation, a control of the reprogram operation will be still complex and non high speed access still remains.

SUMMARY OF INVENTION

An object of the present invention is to provide a non-volatile semiconductor memory device capable of a reprogram operation at a page unit that is controlled easier.

To achieve the object of the present invention, a nonvolatile semiconductor memory device having a data reprogram mode comprises a memory cell array in which a plurality of memory cells are arranged in a matrix form, a page buffer storing one page data to be programmed to memory cells which are selected in accordance with a page address signal, an internal column address generating circuit for generating column addresses of the one page with inputting the page address signal in order to transfer the one data stored in the page buffer to the memory cells, a column decoder receiving the column addresses from the internal column address generating circuit, and a control circuit having a data reprogram mode which is a mode for erasing one page data stored in the memory cells which are selected in accordance with the page address signal and continuously programming the one page data stored in the page buffer to the memory cells which are selected.

It is desirable the reprogram mode includes a verify read operation for confirming a data of a programmed memory cell after programming the one page data.

Also, it is desirable that the control circuit resets the one page data stored in the page buffer in the absent of an input of next one page data to the page buffer within a predetermined period from the input of the one page data.

Also, it is desirable that the internal column address generating circuit is an address resistor for initialized by the control circuit and generating column addresses which are increased one by one.

The nonvolatile semiconductor memory device having a data reprogram mode may further comprises a select gate circuit transferring column address signals to the column decoder, the column address signals being one of the column addresses from the internal column address generating circuit at the data reprogram mode and column addresses inputted from an external nodes at a data read out mode.

Also, it is desirable that each of the memory cells of the one page has a control gate, a drain node and a source node, the control gates are connected commonly, each of the drain node is connected to a bit line via a first select transistor, each of the source node is connected to the source line via second select transistor.

A nonvolatile semiconductor memory device having a data reprogram mode comprises a memory cell array including a plurality of memory cells which are formed in a matrix form and a plurality of bit lines, a page buffer circuit storing one page data which should be programmed to memory cells, the page buffer circuit being connected to the plurality of the bit lines, column gates connected to the plurality of the bit lines via the page buffer circuit and selecting a predetermined number of the bit lines, a column decoder transforming column address to the column gates, a sense amplifier circuit for detecting and amplifying a data which is stored in the memory cell in the memory cell array and the sense amplifier circuit being connected to the column gates, a column address buffer circuit receiving page column address signals which are supplied to an external terminal, an internal column address signal generating circuit for generating column address signals at a data reprogram operation in order to load the one page data which are stored in the memory cells to the page buffer circuit, a select gate circuit selecting one of the column address signals which are generated at the internal column address signal generating circuit and the page column address signals which are latched in the page buffer circuit and transforming to the column decoder circuit ,and a control circuit for controlling the data reprogram mode at which all of data stored in the memory cells selected by the page column address signals are erased and continuously data loaded to the page buffer circuits are programmed to the memory cells which are erased.

BRIEF DESCRIPTION OF THE DRAWINGS

FIG. 9 shows a voltage table at each of operations in the first embodiment of the present invention.

DETAILED DESCRIPTION OF THE INVENTION

We will explain about a first embodiment of the present invention with reference to figures attached.

Figure 1:
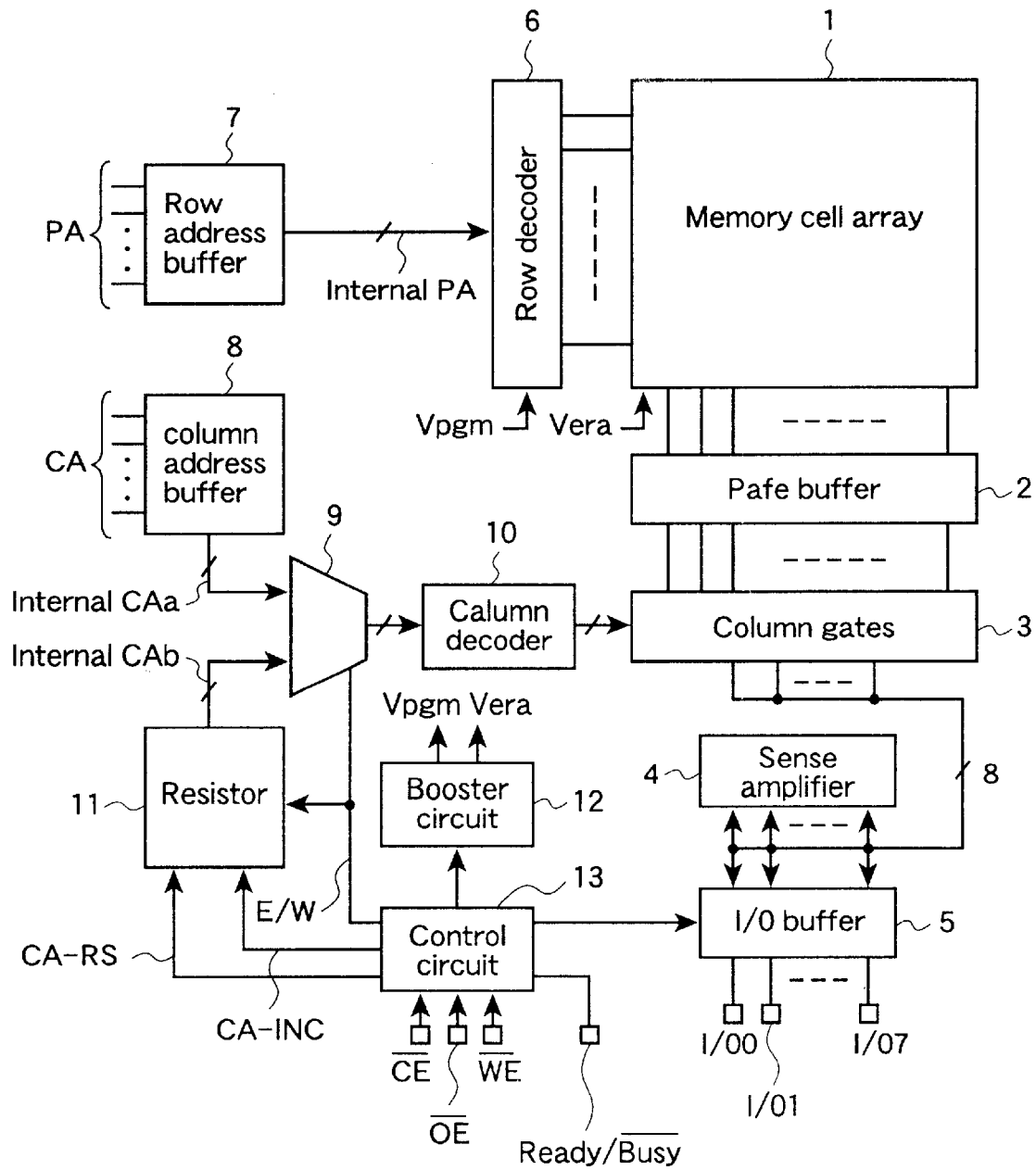
FIG. 1 shows a block diagram of EEPROM in a first embodiment of a present invention.
Figure 2:
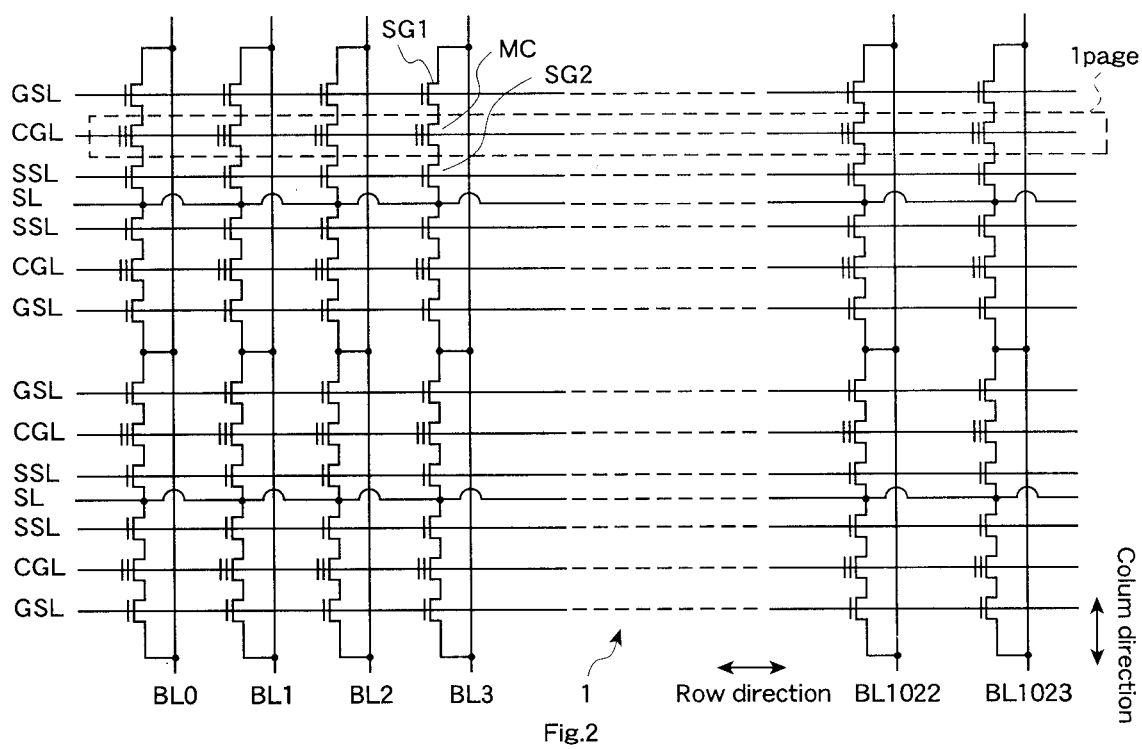
FIG. 2 shows an equivalent circuit diagram of a memory cell array in the first embodiment of the present invention.

FIG. 1 shows a block diagram of EEPROM in the first embodiment of the present invention. As shown in FIG. 2, a memory cell array 1 is comprised of a plurality of nonvolatile memory cells that are arranged in a matrix form. A drain node of the memory cell MC is connected to a bit line BLn (n is an integral number) via a select transistor SG1. A source node of the memory cell MC is connected to a common source line SL via a select transistor SG2. In other words, a memory cell unit is comprised of three transistors: the memory cell MC, the select transistor SG1 and SG2.

Each of control gates of the memory cells MC in a row direction is commonly connected to a control gate line CGL. Similarly, Each of gate electrodes of the select gate transistor SG1 in a row direction is commonly connected to a select gate line GSL. And each of gate electrodes of the select gate transistor SG2 in a row direction is commonly connected to a select gate line SSL. In a case of the first embodiment in the present invention, one page that is a unit of a data reprogram is defined by the 1024 memory cells (128 bytes) connected to the control gate line CGL. A range of the one page is surrounded by a broken line in FIG. 2.

A page buffer 2 to which the one page data (for example, 1024 bits) that should be programmed to the memory cells are loaded at the data reprogram operation is provided to the bit lines BL that are arranged in the memory cell array 1. Specifically, the page buffer 2 is comprised of data latch circuits, each of which is connected to the corresponding one of the bit lines BL. The bit lines BL are selected every one column by column gates 3 that are controlled by the bit lines BL or a column decoder 10. The bit lines BL are connected to a sense amplifier 4 and an I/O buffer 5. Hereinafter, we will explain about the case where the one column is one byte (for example, 8 bits). But the one column may be one word (16 bits) or a plurality of bits. At the data reprogram operation, one page data that are supplied every one byte from input output terminals I/O 0 to I/O 7 are loaded to the page buffer 2 via the I/O buffer 5 every one byte. And the page buffer 2 is connected to the column gates 3 that are selected by the column decoder 10. Also, at the data read out operation, read out data of one byte which are selected by the column gates 3 are detected and amplified at the sense amplifier 4, and the data which are detected and amplified are outputted to the input output terminals I/O 0 to I/O 7 via the I/O buffer 5.

The row decoder 6 selects the control gate line CGL, the select gate line GSL and SSL which are arranged in the memory cell array 1. A page address signal PA is latched in a row address buffer 7 from external terminals (not shown in FIG. 1). The page address signal PA which is latched in the row address buffer 7 are decoded by a row decoder 6. In accordance with a operation mode, the row decoder 6 outputs a predetermined voltage to the control gate line CGL, the selected gate line GSL and selected gate line SSL which are arranged in the selected page.

At the read out mode, a column address signal CA that is supplied from an external circuit is latched in the column address buffer 8. Thereby, the column address buffer 8 outputs an internal column address signal CAa. On the other hand, at the data reprogram mode, an address resistor 11 is provided as a column address generating circuit which automatically generates an internal column address signal CAb. At the data reprogram mode, the address resistor 11 is initialized by receiving a column address reset signal CA-RS which is generated by a control circuit 13. The address resistor 11 generates an internal column address signal CAb which is updated in order by receiving a column address increment signal CA-INC.

A select gate circuit 9 selects one of the internal column address signal CAa which is latched in the column address buffer 8 at the data read out mode and one of the internal column address signal CAb which is generated by the address resistor 11 at the data reprogram mode. The selected one of the internal column address signal CAa and CAb is transferred to the column decoder 10. The select gate circuit 9 is switched in accordance with a control signal E/W that is outputted by a control circuit 13.

The chip enable signal /CE, the write enable signal /WE and the output enable signal /OE are inputted to the control circuit 13 in correspondence with the operation modes. The control circuit 13 includes an oscillator circuit and a counter circuit, and generates the column address reset signal CA-RS for controlling the address resistor 11, the column address increment signal CA-INC, the control signal E/W for controlling the select gate circuit 9 and so on in accordance with a logic of a control input signal.

A booster circuit 12 generates one of a program voltage Vpgm, an erase voltage Vera and so on in accordance with the operation modes. The booster circuit 12 is also controlled by the control circuit 13. The control circuit 13 generates some internal timing signals for controlling a sequence of an automatic data reprogram operation at the data reprogram mode.

Figure 3:
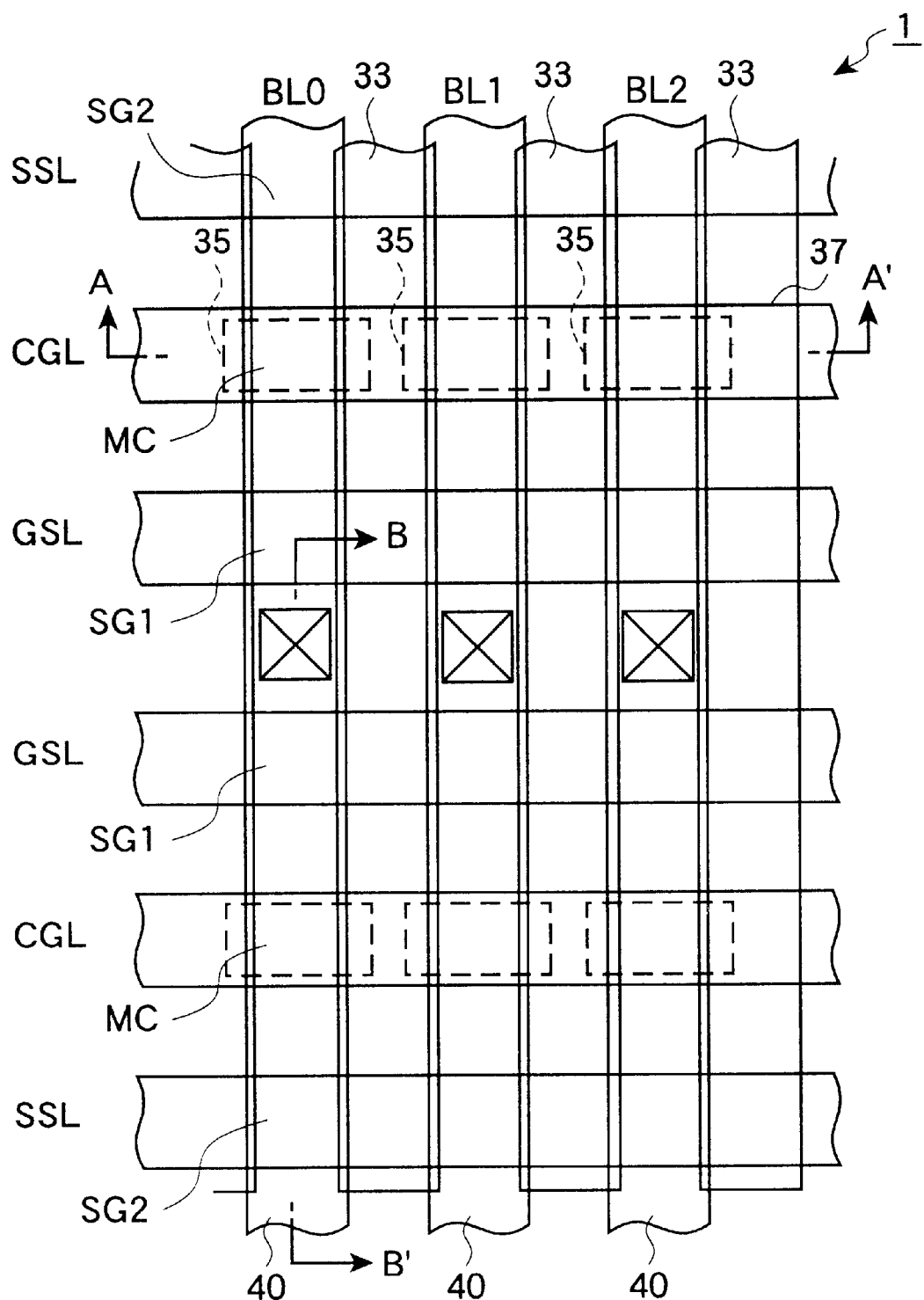
FIG. 3 shows a layout diagram of the memory cell array.
Figure 4A:
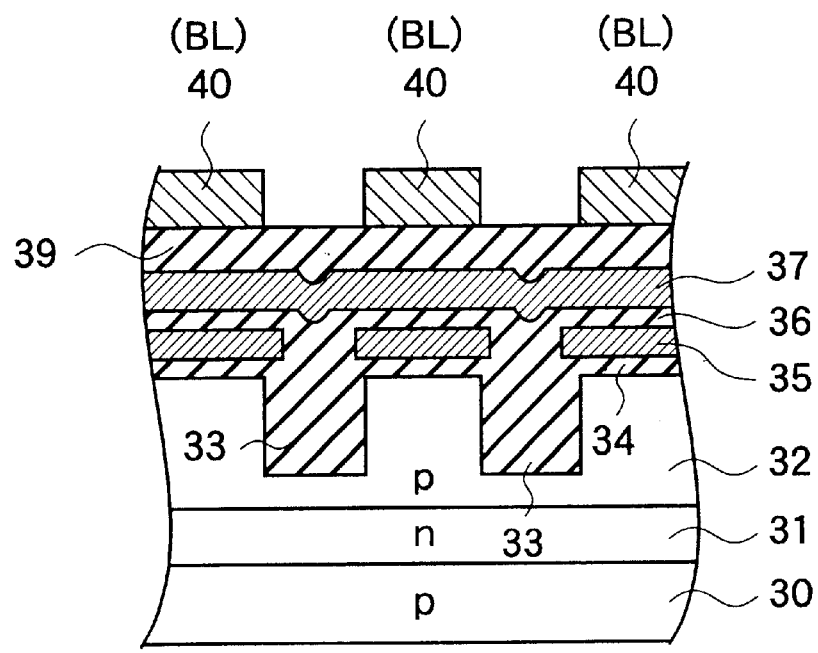
FIG. 4 shows cross-sectional views of AA' and BB' cross-sections in FIG. 3 respectively.
Figure 4B:
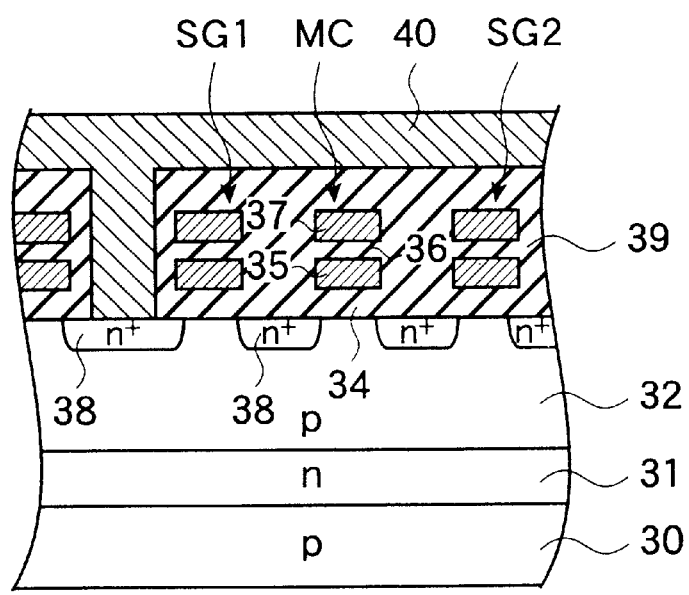

FIG. 3 shows a layout diagram of the memory cell array 1. FIGS. 4a and 4b show cross sectional views of AA' and BB' illustrated in the FIG. 3 respectively. An n-well 31 is formed in a p-type silicon substrate 30. A p-well 32 which will become a cell array area is formed in the n-well 31. Element isolation insulating films 33 at a stripe form are formed in the p-type silicon substrate 30 that includes the p-well 32 by means of a STI (Shallow Trench Isolation) technique. A floating gate 35 that is a first gate film on a tunnel insulating film 34 is formed on the p-well 32 between the element isolation insulating films 33. A control gate 37 that is a second gate film is formed on an insulating film 36 that is formed on the floating gate 35. Thereby, the memory cell MC of a stacked gate structure is formed.

The floating gate 35 is separated at every memory cell MC. The control gate 37 is formed continuously in the row direction, and becomes the control gate CGL. The select gate transistors SG1 and SG2 have a same structure as the memory cell MC. But the first gate film and the second gate film of each select gate transistor SG1 and SG2 are shorted at an appropriate portion, and the select gate lines GSL and SSL respectively are formed. A drain diffusion layer and a source diffusion layer 38 of the memory cell MC, the select gate transistors SG1 and SG2 are formed at self-align for the control gate line CGL, the select gate lines GSL and SSL. An interlayer insulating film 39 is formed on a semiconductor substrate in which elements are formed. A bit line 40 is arranged on the interlayer insulating film 39.

The EEPROM including three transistors memory cell units in the first embodiment is characterized in that the data reprogram operation can be carried out at a page unit, that the data reprogram operation of one page includes the sequential operations of the data erase operation, the data program operation and the program verify read operation, and that the data reprogram mode is controlled by an input of an external control signal without an input of commands.

Figure 5:
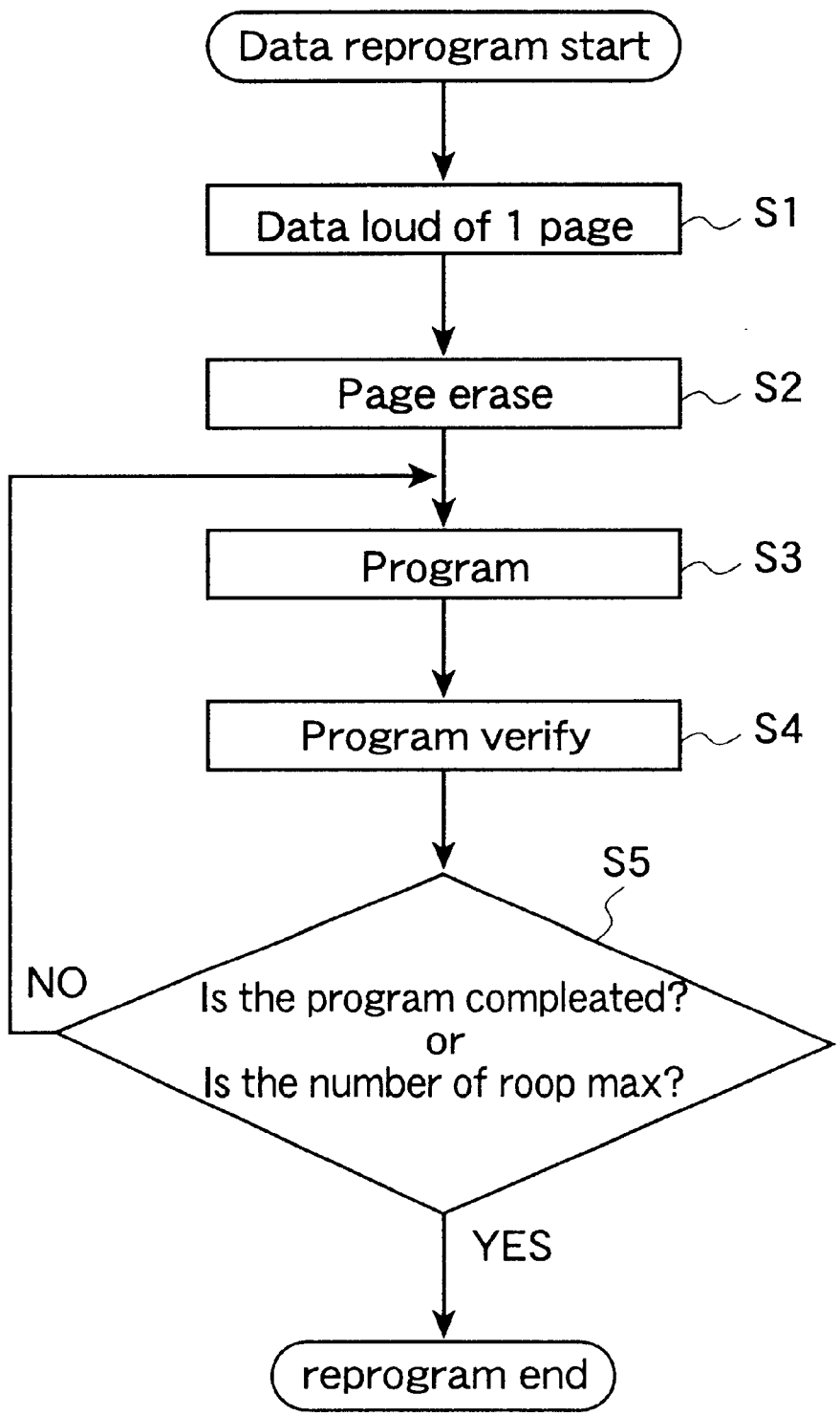
FIG. 5 shows a basic flow diagram of a data reprogram operation in the first embodiment of the present invention.

FIG. 5 shows a basic flow diagram of the data reprogram mode. In the data reprogram mode, first of all, program data of one page are loaded to the page buffer 2 (S1). After that, all of one page data stored in the memory cells that are selected by a page address are erased (S2). Next, the data loaded to the page buffer 2 are programmed to one page of the memory cells that were erased (S3). And then, the program verify read operation is carried out (S4). The program verify read operation is carried out at a byte unit.

At the program verify read operation, the data that are latched in the page buffer 2 corresponding to the memory cell are made inverted. In the case where all of the programming to the memory cells in the selected page are not enough, a fail flag is stood up. On the other hand, in the case where all of the programs are enough, a result of the verify read operation is a pass and the fail flag is not stood up. After the program verify read operation of the one page, it is judged whether or not a result of the program verify read operation is a pass and the number of program loops reaches a maximum number or not (S5). If the judgment of the step S5 is YES, the reprogram operation is over. If the fail flag is stood up and the number of the program loops does not reach the maximum number, the judgment of the step S5 is NO and the reprogram operation is not over and the data program is carried out again (S3). This second program operation is substantially carried out for the only memory cells that were not enough programming because the data stored in the page buffer 2 which corresponds to the memory cells that were enough programming are reprogrammed. It is noted that although the fail flag is stood up, the reprogram operation is forcibly ended as the fail in the case where the repeat loop number of the program operation and the program verify read operation reached the maximum number.

Figure 6:
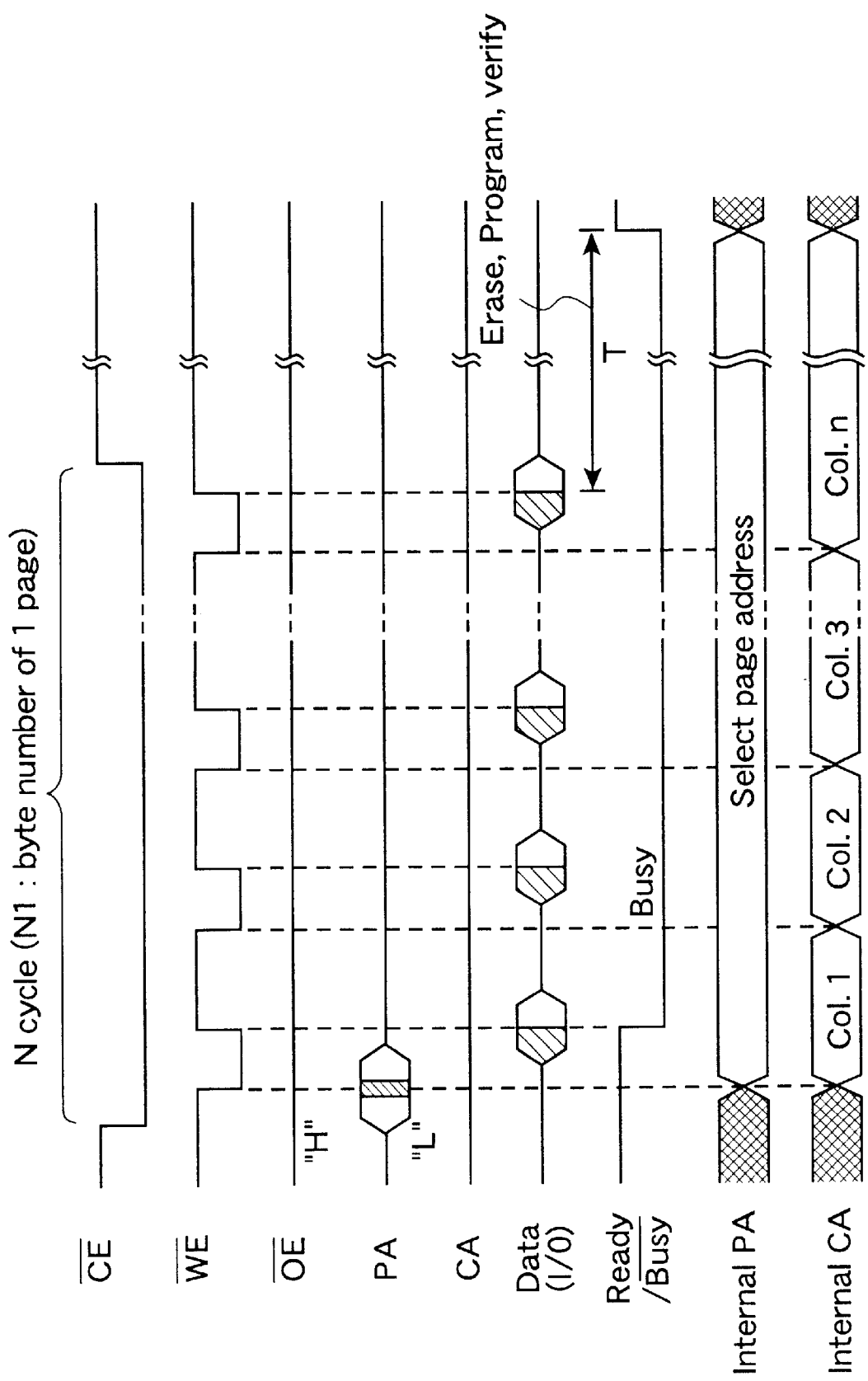
FIG. 6 shows a timing diagram of the data reprogram operation in the first embodiment of the present invention.

FIG. 6 shows a timing diagram of the above-mentioned data reprogram operation. Fist of all, the chip enable signal /CE is set to Low level, thereby selecting the chip. The output enable signal /OE remains High level during the reprogram operation. After the chip is selected, each time the write enable signal /WE is set to Low level, some bytes data which deserve one page data are inputted to the chip in order. When the write enable signal /WE is set to Low level at first time, only a page address signal PA is inputted. Thereby, the page address signal PA is latched in the address buffer 7 until the reprogram operation ends.

The external column address CA is not inputted. The address terminals to which the external column address CA should be inputted remains Low level. At the reprogram mode, an output signal from the address resistor 11 is used as the internal column address signal. The internal column address signal is set (initialized) to a head column address Col. 1 in the address resistor 11 at the first fall edge of the write enable signal /WE in accordance with a column address reset signal CA-RS that is generated by the control circuit 13. When the first write enable signal /WE raises, the control circuit 13 outputs a Ready/Busy signal of Low level (=Busy) to an external circuit. And, hereafter, each time the write enable signal /WE is set to Low level, the internal column address signals Col.2, Col.3, are automatically increased and generated in response to the increment signal CA-INC that is generated by the control circuit 13. Also, the I/O buffer 5 is controlled in synchronous with the write enable signal /WE, and latches program data that is supplied from the I/O terminal every one byte. The program data that are latched in the I/O buffer 5 are stored in the page buffer 2 every one column in response to the internal column address signal which is incremented.

Figure 8:
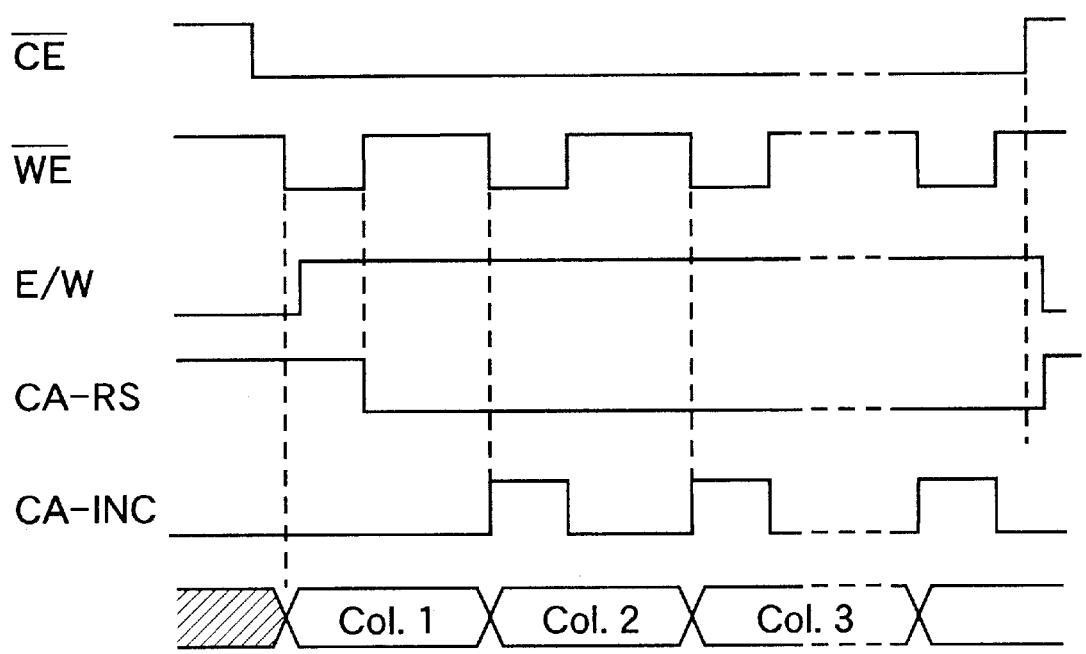
FIG. 8 shows a control signals in an address resistor shown in FIG. 1 at the data reprogram operation.

FIG. 8 shows a timing diagram to generate the above-mentioned column address reset signal CA-RS and the column address increment signal CA-INC on a basis of the write enable signal /WE. In FIG. 8, a control signal E/W in the select gate circuit 9 that is a signal to switch the internal column address signal and is inputted to the select gate circuit 9 is also shown. The control signal E/W is a signal that raises in the cases where the chip enable signal /CE is set to Low level and the write enable signal /WE is set to Low level, and that remains High level during the reprogram operation. The control signal E/W is generated in the control circuit 13, thereby selecting the internal column address signal CAb that is outputted from the address resistor 11.

When the one page data are loaded to the page latch and the internal column address is increased up to the final address, the reprogram operation will start automatically. A time period T for carrying out the reprogram operation is set up by a timer in advance. In the reprogram operation, data stored in all of the one page memory cells that are selected by the internal page address are erased. And then, data are programmed to all of the one page memory cells that are erased. After that, the program verify read operation is carried out if the chip has an automatic verify function. When the data reprogram operation finished, the control circuit 13 outputs the Ready/Busy signal of High level (=Ready).

It is noted that at the program verify read operation, the control circuit 13 initializes the internal column address and carries out the increment operation of the internal column address since data stored in the memory cells are read out to the sense amplifier circuit 4 every one byte.

Figure 7:
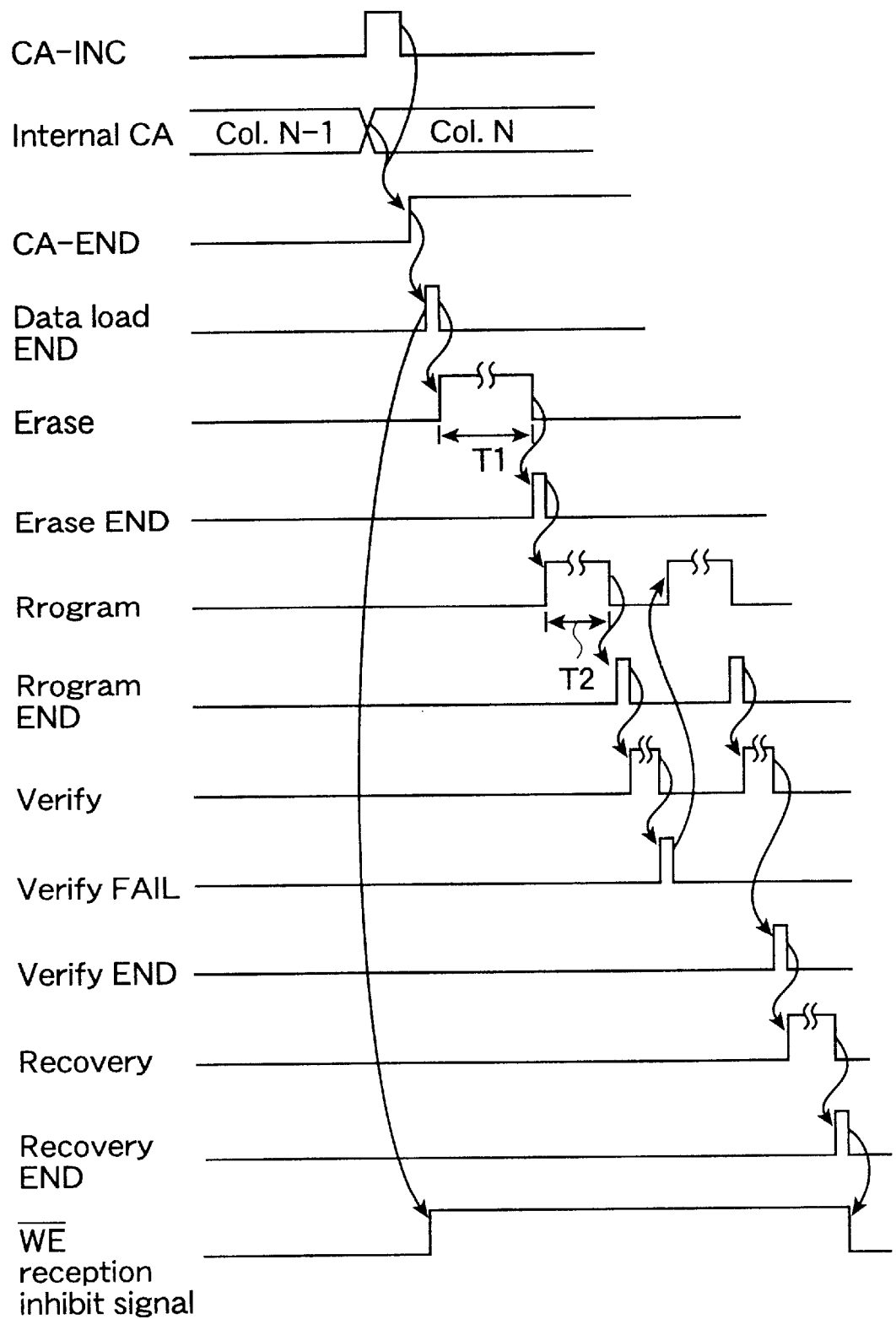
FIG. 7 shows detailed and internal timing signals of the data reprogram operation in the first embodiment of the present invention.

FIG. 7 shows internal signals to control the automatic erase, program and program verify read operation after the data load. When a N times data load operation ends and the internal column address signal is increased up to the final address, the column address signal is set to High level, thereby outputting a data load end pulse signal Data Load End.

In response to the data load end pulse signal Data Load End, an erase pulse Erase is generated. A pulse time T1 of the erase pulse Erase is set up by a timer in advance, and an erase operation of a page selected within the pulse time T1 of the erase pulse Erase is carried out. Specifically, the erase pulse Erase is a pulse for controlling the booster circuit 12 illustrated in FIG. 1. In response to the erase pulse Erase, the booster circuit 12 generates a pulse of a boosted erase voltage Vera. It is noted that the erase operation may include an erase verify read operation.

When the erase operation finishes, an erase end pulse Erase END is outputted. In response to the erase end pulse Erase END, a program pulse Program of High level is generated. A pulse time 2 of the program pulse Program also is set up by a timer in advance. Specifically, the program pulse Program is a pulse for controlling the booster circuit 12 illustrated in FIG. 1. In response to the program pulse Program, the booster circuit 12 generates a pulse of a boosted program voltage Vpgm. When the program operation finishes, a program end pulse Program END is outputted. In response to the program end pulse Program END, a program verify signal Verify is set to High level, thereby carrying out the program verify read operation. If a result of the program verify read operation is a fail, a verify fail pulse Verify FAIL is outputted and the program operation and program verify read operation are repeated.

When a verify result is a pass or the number of the loops is a maximum, a verify end pulse Verify END is outputted. On the basis of the verify end pulse Verify END, a recovery signal Recovery is outputted. In response to the recovery signal Recovery, the chip is initialized. If the recovery end pulse Recovery END is outputted, the ready/busy signal is set to High level (=Ready), thereby finishing the reprogram mode.

It is noted that in order to inhibit the reception of the write enable signal /WE after the data load operation, as shown in FIG. 7, on the basis of the data load end pulse Data load END, a /WE reception inhibit signal may be outputted until an end of the reprogram operation. Thereby, the data load operation after an N times data load operation can be ignored.

All of the internal signals illustrated in FIG. 7 are generated by an internal timing signal generation circuit and the timer which are included in the control circuit 13. The details are not shown. But, the internal timing signal generation circuit is comprised of a combination of a basic logic gate, a flip-flop, a shift resistor, an incremental circuit and so on. The timer is comprised of a counter to count a system clock.

FIG. 9 shows an example of voltage relationships at each operation modes of three transistors type memory cell unit in this embodiment of the present invention. Basic voltage relationships are same as the NAND type EEPROM. But, unlike the NAND type EEPROM, an intermediate voltage (a pass voltage) is not needed to use non-selected memory cells in a selected block as turned-on transistors.

At the erase operation in the reprogram operation, the erase voltage Vera is supplied to the p-type well of the memory cell array, and the control gate line CGL in a selected page is supplied with 0 V, and the select gate lines GSL and SSL that are located both sides thereof is a floating state. In a non-selected page control gate lines and select gate lines are all floating states. Voltages of the bit line BL and the common source line SL are set to a voltage that is a value lowered a built-in potential Vb of a PN junction from an erase voltage Vera which is supplied to the p-type well. Thereby, at all of the memory cells in the selected page, electrons in the floating gates thereof are emitted to a channel region by the FN tunneling, thereby becoming an erase state ("1" data state) at which a threshold voltage thereof is lower.

At the data program operation, in accordance with a program data "1" or "0" which should be programmed to the memory cell, a voltage supply Vcc or 0V is supplied to the bit line BL in advance. And the select gate lines GSL connected to the bit line in the selected page are supplied with the voltage supply Vcc and the select gate lines SSL connected to the common source line is supplied with the voltage supply 0V. Thereby, in accordance with a potential of the bit line, the channel of the memory cell is preliminary charged to one of Vcc-Vth (Vth indicates a threshold voltage of the select gate transistor) and 0V. The select gate transistors connected to the bit line which is supplied with "1" data are turned OFF. In the non-selected page, all of the control gate lines and the select gate lines are set to 0V.

The p-well is supplied with 0V and the control gate line CGL of a selected page is supplied with the program voltage Vpgm. At a memory cell that exists in the selected page and is electrically connected to the bit line which is supplied with "0" data, lager electric field is provided between a floating gate thereof and a channel region thereof. In result, electrons are injected from the channel region to the floating gate by FN tunneling and a threshold voltage of the memory cell becomes higher ("0" data state). On the other hand, at a memory cell that exists in the selected page and is electrically connected to the bit line which is supplied with "1" data, the channel region thereof becomes a floating state. In result, a voltage of the channel region with the floating state becomes higher by a capacitive coupling and electrons are not injected from the channel region to the floating gate. Therefore, a threshold voltage of the memory cell maintains a "1" state.

After the chip enable signal /CE is set to Low level and the output enable signal /OE is set to High level, the date read operation is started. At this data read operation, the select gate circuit 9 is controlled by the control circuit 13 so as to select a column address signal CAa which is latched from an external circuit to the column address buffer 8 (see FIG. 1). The select gate lines GSL and SLL in the selected page are supplied with Vcc and the control gate line CGL is supplied with 0V. The sense amplifier circuit 4 detects one byte data which are selected by the column address. And the data are outputted from the I/O terminals via the I/O buffer 5. At a non-selected page, the control gate line and the select gate line are set to 0V.

Effects that we can obtain at this embodiment are as follows.

(a) After a page address is inputted and one page data that should be programmed are loaded, the sequential operations of an erase operation, a program operation and a program verify operation are automatically carried out. At the erase operation and the program operation, both a data erase unit and a program unit are a page unit. Therefore, it is not necessary that an erase mode and a program mode are controlled separately such as the normal NAND type EEPROM.

(b) The column address signal is generated automatically in the chip. In result, such a complex control that the address signal is inputted every data load operation at a byte type EEPROM is not needed. In other words, once a page address signal is inputted, an input of an address is not needed every data load operation.

(C) A complex control input operation such as a command input system at the normal NAND type EEPROM is not needed. Basically the data reprogram control is carried out only by an input of a page address and a data load operation on a basis of an input of the write enable signal /WE. In result, the control is very easy.

Also, in this embodiment, effects by using a 3 Transistors memory cell unit are as follows.

(d) Unlike the normal NAND type EEPROM, it is not needed that a pass voltage is supplied to non-selected control gate lines in a selected block at a program or read out operation. In a result, unnecessary voltage stress is not given to memory cells and we can take high reliability.

(e) At the normal NAND type EEPROM, as mentioned above, the non-selected memory cells must be turn on or off, so that threshold voltages of the non-selected memory cells at an erase and a program operation are controlled strictly. Specifically, distributions of the threshold voltages thereof must be put within a narrow range not to over-erase or over-program. Therefore, the control of the program or the erase operation is difficult, and it also takes a long time. On the other hand, in the case of this embodiment in a present invention, the non-selected memory cells are not used as turned-on transistors, so that the threshold voltages of the non-selected memory cells are not controlled strictly and the program and the erase operation also is easier. Therefore, the program verify operation can be omitted.

(f) Unlike the normal NAND type EEPROM, a current path of the memory cells is not long, so that a faster operation is possible.

Figure 10:
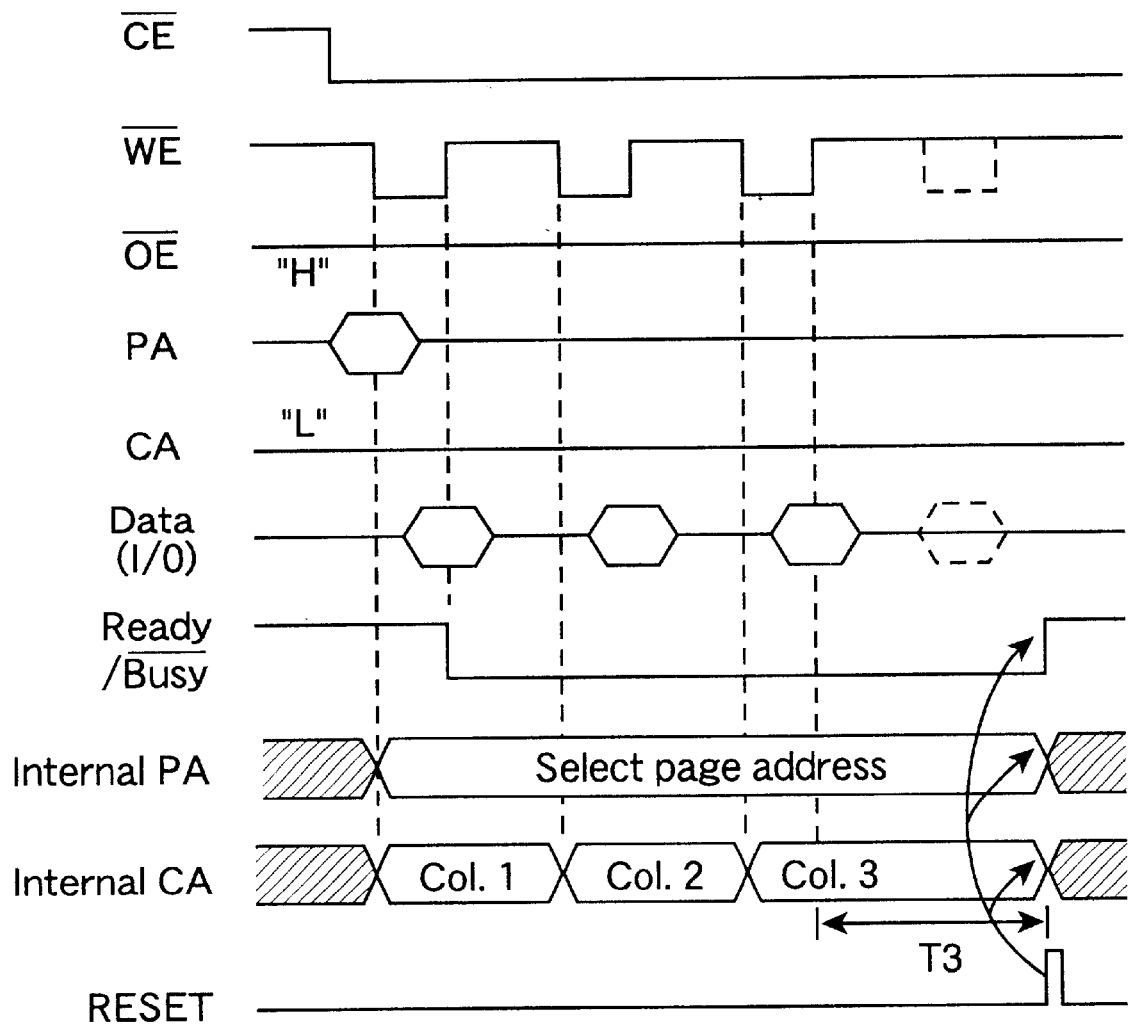
FIG. 10 shows a timing diagram for a case that a waiting time is set for the data load operation.
Figure 11:
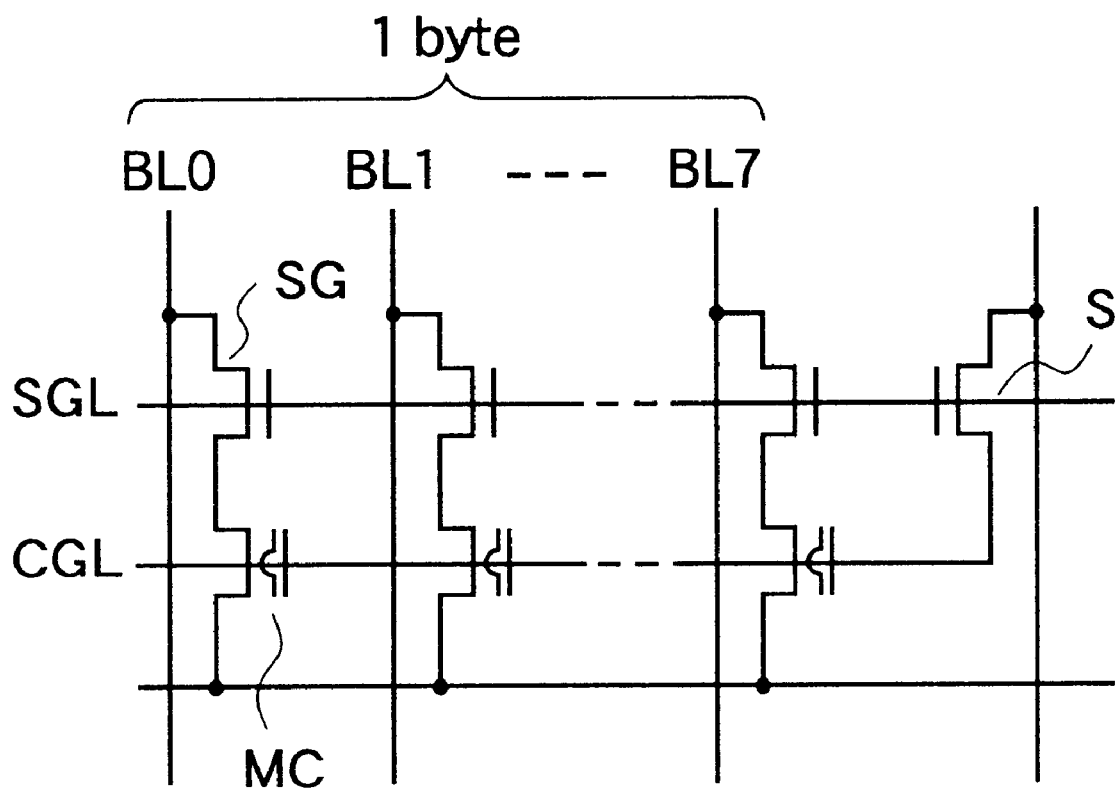
FIG. 11 shows an equivalent circuit diagram of a cell array in a byte type EEPROM.
Figure 12:
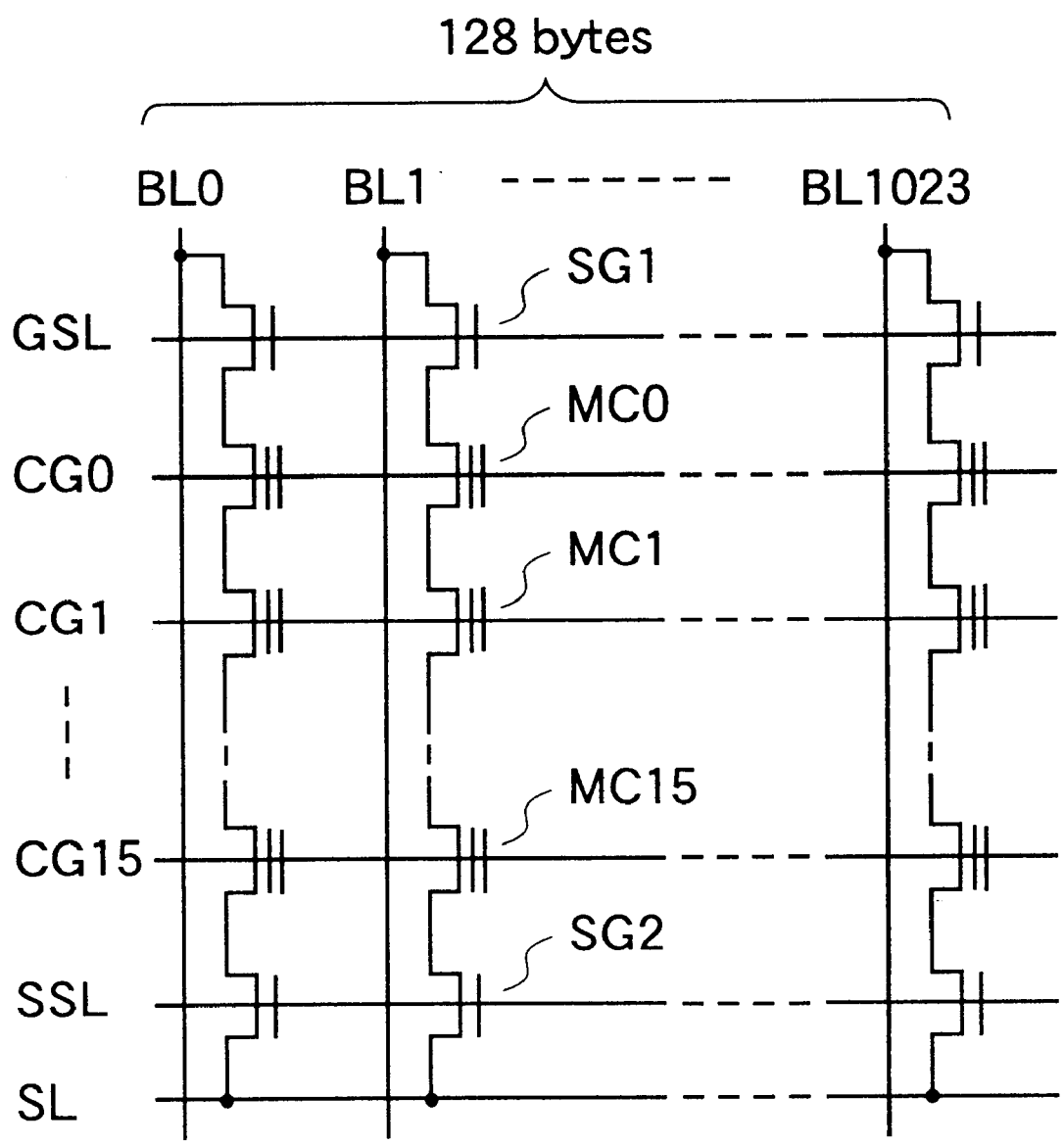
FIG. 12 shows an equivalent circuit diagram of a cell array in a NAND type EEPROM.
Figure 13:
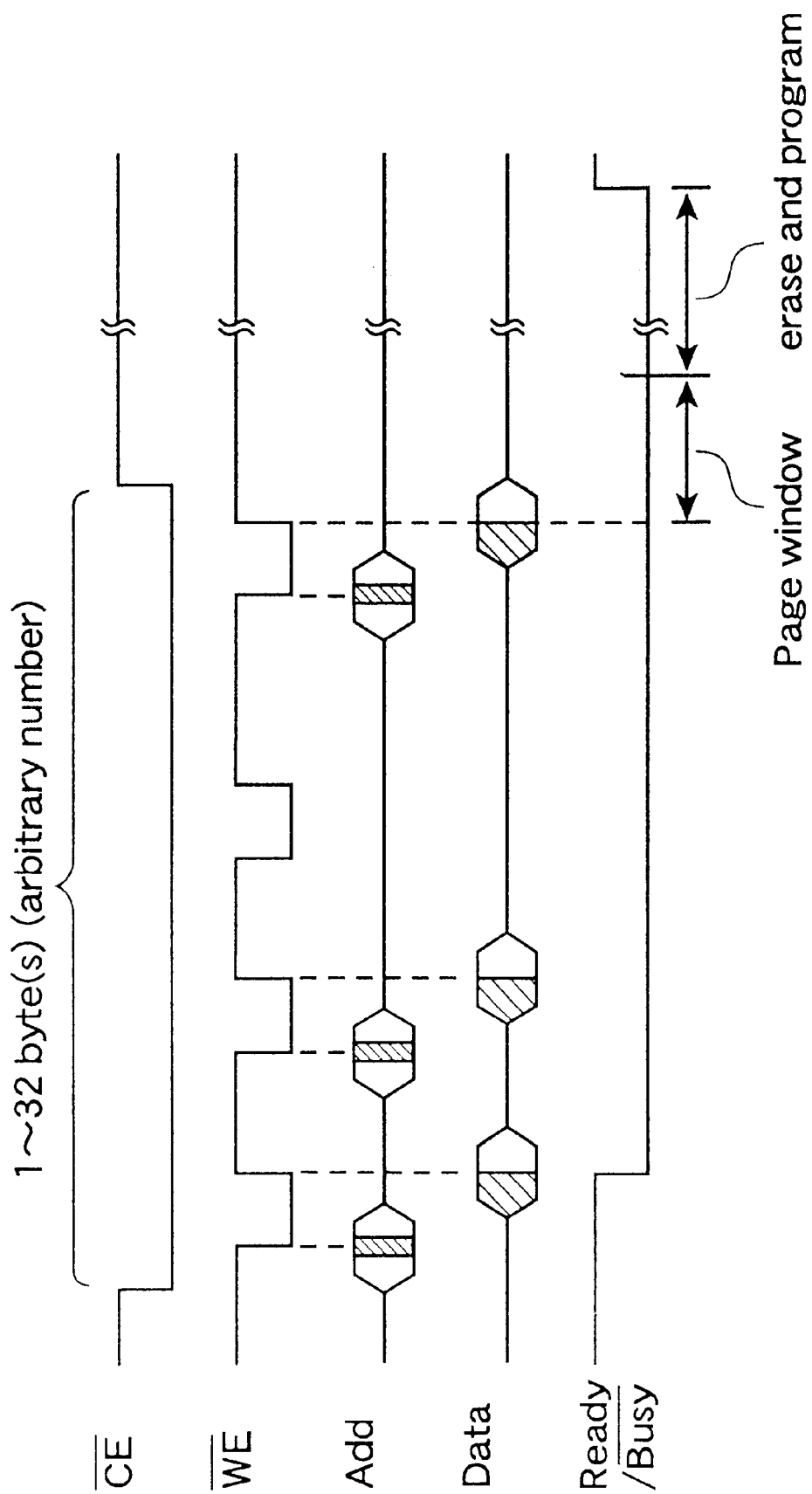
FIG. 13 shows a timing diagram of the data reprogram operation at the byte type EEPROM.
Figure 14:
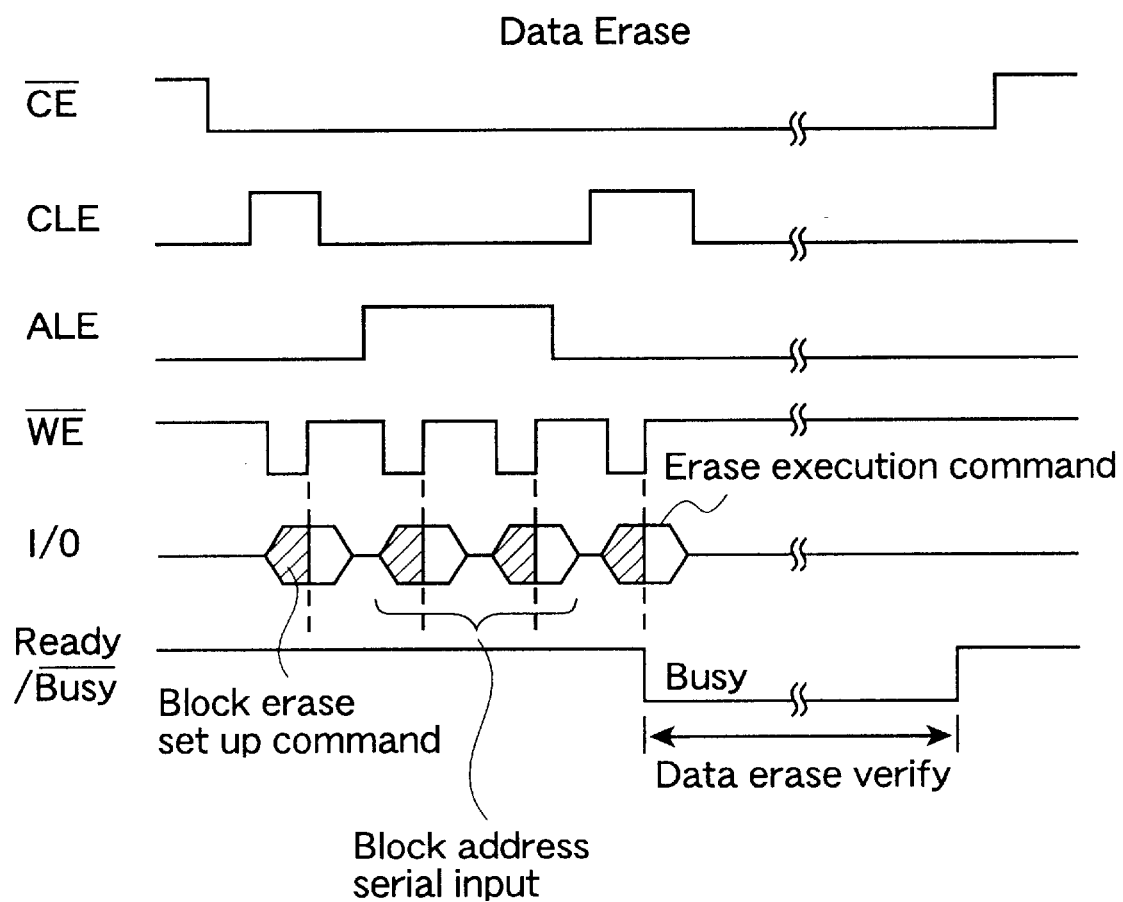
FIG. 14 shows a timing diagram of a data erase operation at the NAND type EEPROM.
Figure 15:
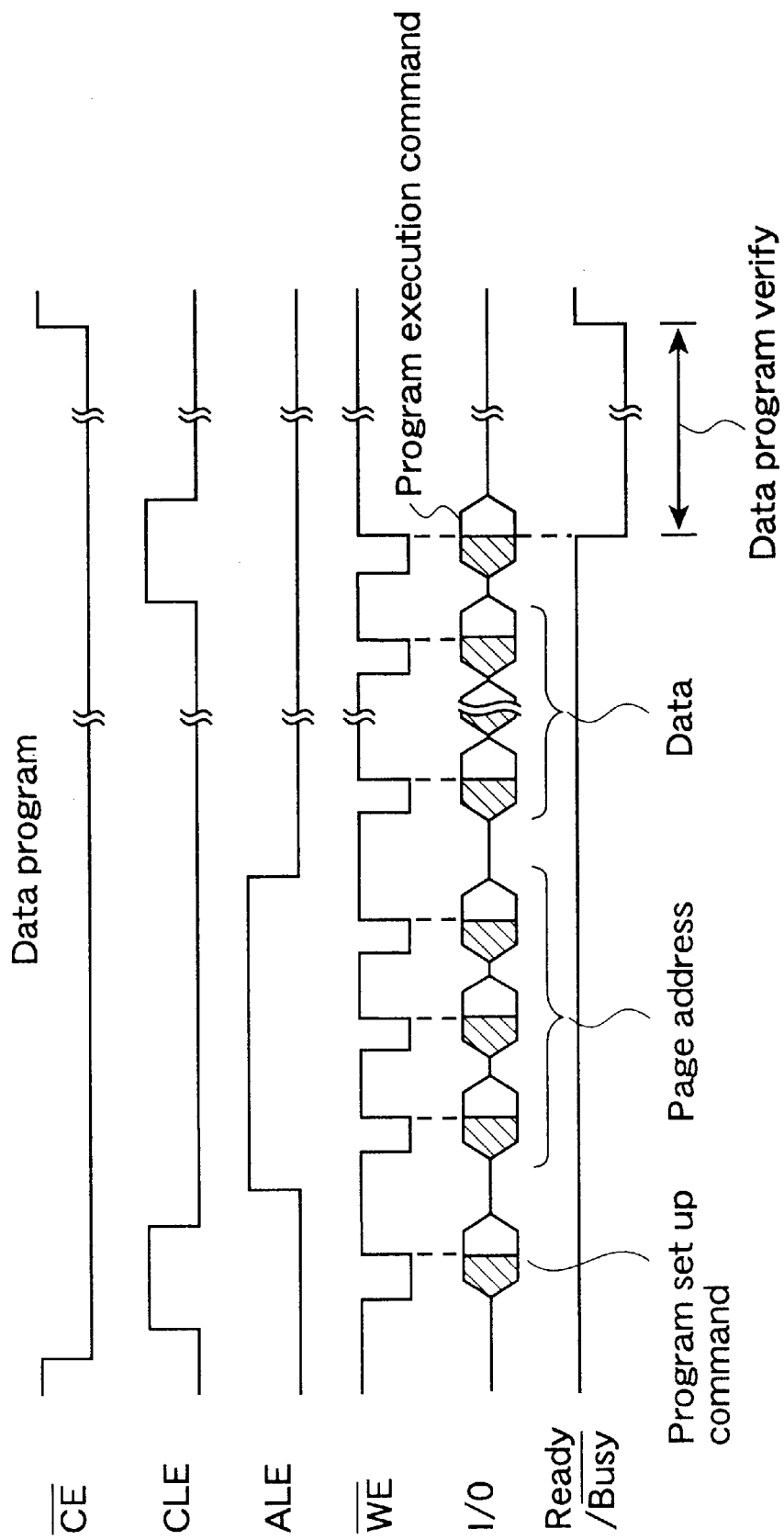
FIG. 15 shows a timing diagram of a data program operation at the NAND type EEPROM.

At the above-mentioned embodiment, when an N times data load operation is stopped on the way, the reprogram mode may be reset after waiting a constant time. FIG. 10 shows timing diagrams for the case where such an operation is carried out. As shown in FIG. 10, a data load waiting time T3 that starts from each of a raise edge of the write enable signal WE is set in advance. If an next program enable signal /WE is inputted within the data load waiting time T3 from the raise edge of a former program enable signal /WE, as explained above, the data load operation of the one page will be carried out in order.

As shown at a broken line in FIG. 10, if an next program enable signal /WE is not inputted within the data load waiting time T3, a reset signal RESET win be generated. In response to the reset signal RESET, all of data loaded until then, a page address latched in the address buffer 7 and the address resistor 11 which stores a incremented column address until then are reset.

Figure 16:
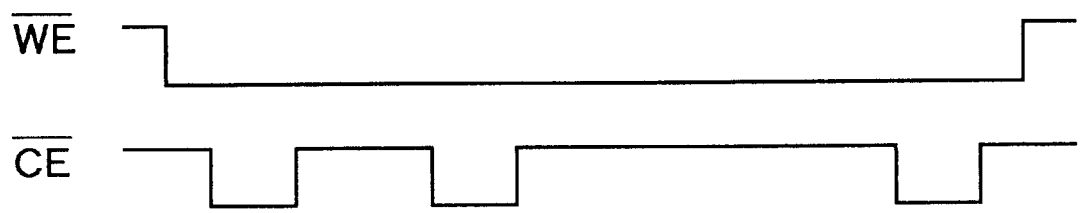
FIG. 16 shows an input method of a chip enable signal /CE and a write enable signal /WE in another embodiment of the present invention.
Figure 17:
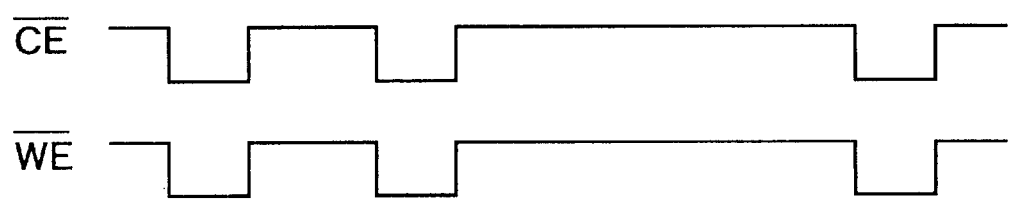
FIG. 17 shows an input method of the chip enable signal /CE and the write enable signal /WE in still another embodiment of the present invention.

It is noted that terminals of the chip enable signal /CE and the write enable signal /WE can be exchanged and these signals are inputted. For example, as shown in FIG. 16, during the write enable signal /WE is set to Low level for N cycles, the chip enable signal /CE may be set to Low level repeatedly. As shown in FIG. 17, the chip enable signal /CE may be set to Low level repeatedly in synchronous to the write enable signal /WE terminals.

At the embodiment mentioned above, we explained in the case of the memory cell unit of the 3 transistors. But the present invention can be applied for a cell array structure of the normal NAND type EEPROM or the byte type EEPROM. In other words, at the NAND type EEPROM, an erase operation at a page unit can be carried out by setting potential relationships suitably. Therefore, a column address is automatically generated in the chip and an operation which includes an erase, a program and a verify read operation at a page unit within a data reprogram mode can be carried out. Also, the same operation can be applied to the byte type EEPROM.

What is claimed is:

1. A nonvolatile semiconductor memory device having a data reprogram mode, comprising:
    a memory cell array in which a plurality of memory cells are arranged in a matrix form;
    a page buffer configured to store one page data to be programmed to memory cells which are selected in accordance with a page address signal;
    an internal column address generating circuit configured to generate column addresses of the one page by inputting the page address signal;
    a column decoder configured to receive the column addresses from the internal column address generating circuit; and
    a control circuit configured to execute a data reprogram operation which includes a load operation, an erase operation, and a program operation continuously, the load operation loading the one page data in accordance with the page address signal, the erase operation erasing the one page data stored in the memory cells which are selected, and the program operation programming the one page data stored in the page buffer to the selected memory cells.

2. The nonvolatile semiconductor memory device having a data reprogram mode according to claim 1, wherein
    the reprogram mode includes a verify read operation for confirming a data of a programmed memory cell after programming the one page data.

3. The nonvolatile semiconductor memory device having a data reprogram mode according to claim 1, wherein
    the control circuit resets the one page data stored in the page buffer in the absent of an input of a next one page data to the page buffer within a predetermined period from the input of the one page data.

4. The nonvolatile semiconductor memory device having a data reprogram mode according to claim 1, wherein
    the internal column address generating circuit is an address resistor for initialized by the control circuit and generating column addresses which are increased one by one.

5. The nonvolatile semiconductor memory device having a data reprogram mode according to claim 1, further comprising:
    a select gate circuit transferring column address signals to the column decoder, the column address signals being one of the column addresses from the internal column address generating circuit at the data reprogram mode and column addresses inputted from external nodes at a data read out mode.

6. The nonvolatile semiconductor memory device having a data reprogram mode according to claim 1, wherein
    each of the memory cells of the one page has a control gate, a drain node and a source node, the control gates are connected commonly, each drain node is connected to a bit line via a first select transistor, and each source node is connected to the source line via second select transistor.

7. A nonvolatile semiconductor memory device having a data reprogram mode, comprising:
    a memory cell array including a plurality of memory cells which are formed in a matrix form and a plurality of bit lines;
    a page buffer circuit configured to store one page data which should be programmed to memory cells, the page buffer circuit being connected to the plurality of the bit lines;
    column gates connected to the plurality of the bit lines via the page buffer circuit and configured to select a predetermined number of the bit lines;
    a column decoder configured to transform a column address to the column gates;
    a sense amplifier circuit configured to detect and amplify a data which is stored in the memory cell in the memory cell array and the sense amplifier circuit being connected to the column gates;
    a column address buffer circuit configured to receive page column address signals which are supplied to an external terminal;
    an internal column address signal generating circuit configured to generate column address signals at a data reprogram operation in order to load the one page data which are stored in the memory cells to the page buffer circuit;
    a select gate circuit configured to select one of the column address signals which are generated at the internal column address signal generating circuit and the page column address signals which are latched in the page buffer circuit and transforming to the column decoder circuit; and
    a control circuit configured to execute a data reprogram operation which executes a load operation, an erase operation, and a program operation continuously, the load operation loading the one page data in accordance with the page address signal, the erase operation erasing the one page data stored in the selected memory cells, and the program operation programming the one page data stored in the page buffer to the selected memory cells.

* * * * *